(12) United States Patent
Quinn et al.

(10) Patent No.: US 11,121,320 B2
(45) Date of Patent: Sep. 14, 2021

(54) ORGANIC VAPOR JET PRINT HEAD WITH REDUNDANT GROUPS OF DEPOSITORS

(71) Applicant: Universal Display Corporation, Ewing, NJ (US)

(72) Inventors: William E. Quinn, Whitehouse Station, NJ (US); Gregory McGraw, Yardley, PA (US); Gregg Kottas, Ewing, NJ (US); Xin Xu, Plainsboro, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 50 days.

(21) Appl. No.: 16/400,218

(22) Filed: May 1, 2019

(65) Prior Publication Data

US 2019/0386216 A1    Dec. 19, 2019

Related U.S. Application Data

(60) Provisional application No. 62/686,115, filed on Jun. 18, 2018.

(51) Int. Cl.
*H01L 51/56* (2006.01)
*H01L 51/00* (2006.01)
(Continued)

(52) U.S. Cl.
CPC .......... *H01L 51/0004* (2013.01); *B05B 12/18* (2018.02); *H01L 51/5004* (2013.01); *H01L 51/5016* (2013.01); *H01L 51/56* (2013.01)

(58) Field of Classification Search
CPC . H01L 51/0004; H01L 51/56; H01L 51/5016; H01L 51/5004; H01L 51/50;
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.
(Continued)

*Primary Examiner* — Rudy Zervigon
(74) *Attorney, Agent, or Firm* — Butzel Long

(57) ABSTRACT

Embodiments of the disclosed subject matter provide a device including a micronozzle array having separate redundant groups of depositors that each include a delivery aperture disposed between two exhaust apertures. The device may include a first row of depositors of a first redundant group, each of which may be connected in parallel to first common delivery lines and first common exhaust lines. The device may include a second row of depositors of a second redundant group, each of which is connected in parallel to second common delivery and second common exhaust lines. The first row of depositors and the second row of depositors may operate independently from one another. The device may be disposed within a deposition chamber and in proximity of a substrate.

19 Claims, 9 Drawing Sheets

(51) Int. Cl.
*B05B 12/18* (2018.01)
*H01L 51/50* (2006.01)

(58) Field of Classification Search
CPC ............. H01L 51/5203; H01L 21/6708; H01L 51/0005; B05B 12/18; B05B 13/0452; B05B 1/14; B05B 1/3046; B05B 1/3053; B05B 1/306; B05B 1/3073; B05B 1/32; B33Y 30/00; B33Y 10/00; B33Y 50/02; B33Y 40/00; B33Y 50/00; B05C 5/0275
USPC .................................. 118/15, 715; 156/345.1
See application file for complete search history.

(56) References Cited

U.S. PATENT DOCUMENTS

| | | | |
|---|---|---|---|
| 5,380,396 A * | 1/1995 | Shikida | F04B 43/043 118/728 |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,020,981 B2 * | 4/2006 | Shero | C23C 16/4412 118/715 |
| 7,279,704 B2 | 10/2007 | Walters | |
| 7,431,968 B1 | 10/2008 | Shtein | |
| 7,968,146 B2 | 6/2011 | Wagner | |
| 2003/0230980 A1 | 12/2003 | Forrest | |
| 2004/0174116 A1 | 9/2004 | Lu | |
| 2004/0216668 A1 * | 11/2004 | Lindfors | C23C 16/45574 118/715 |
| 2009/0229524 A1 * | 9/2009 | Kim | C23C 14/243 118/726 |
| 2015/0376787 A1 | 12/2015 | McGraw | |
| 2017/0229663 A1 | 8/2017 | Tsai | |
| 2017/0294615 A1 | 10/2017 | Van Den Tillaart | |
| 2018/0342675 A1 | 11/2018 | Xu | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

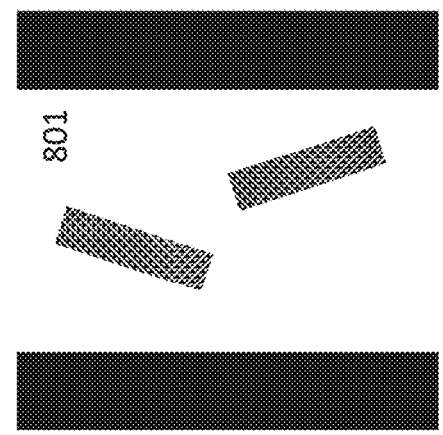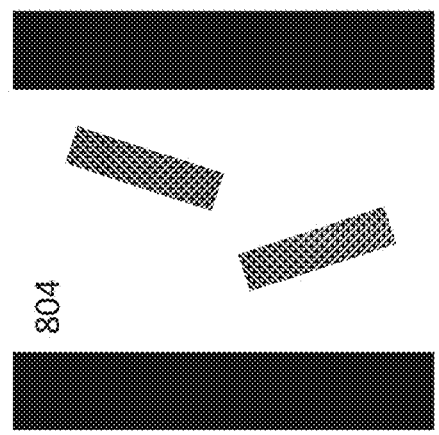
FIG. 8
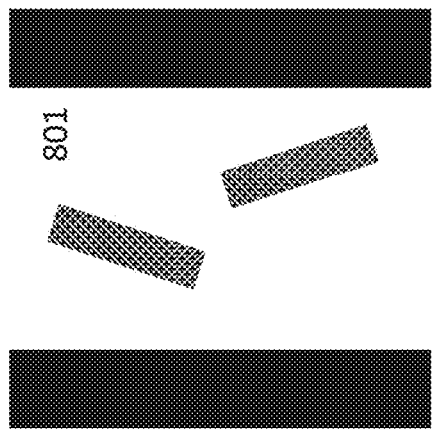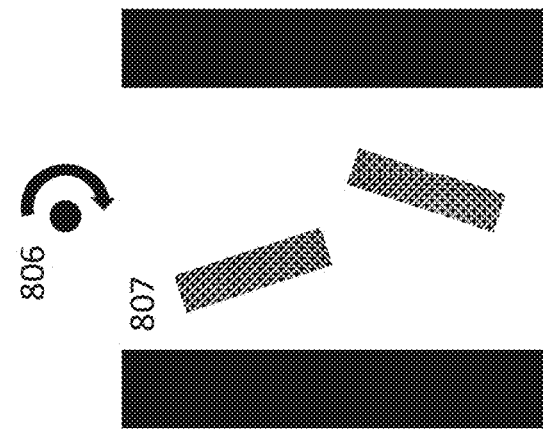
FIG. 8C
FIG. 8B
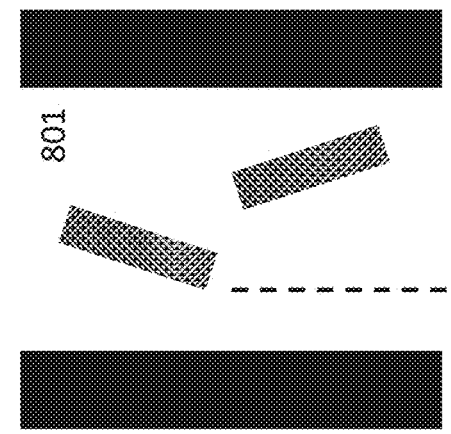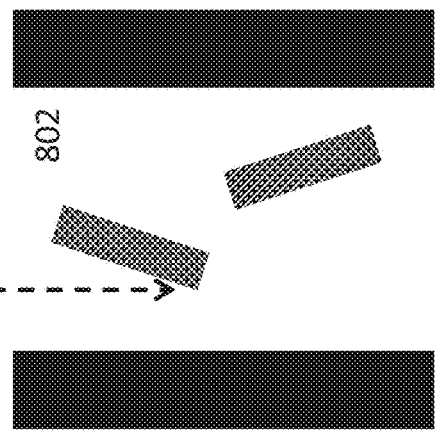
FIG. 8A

FIG. 9
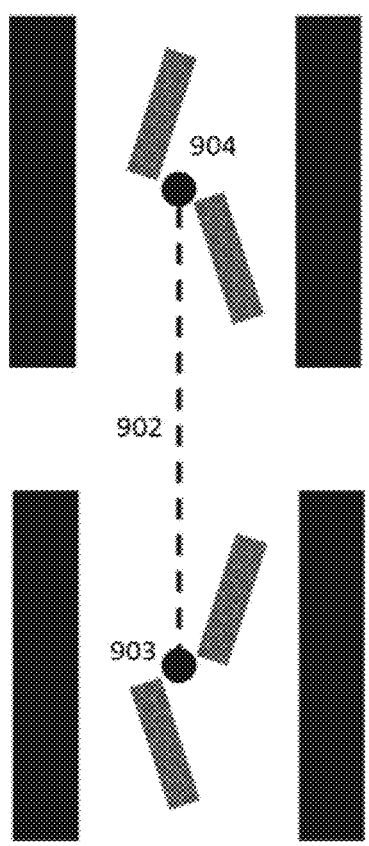
FIG. 9A
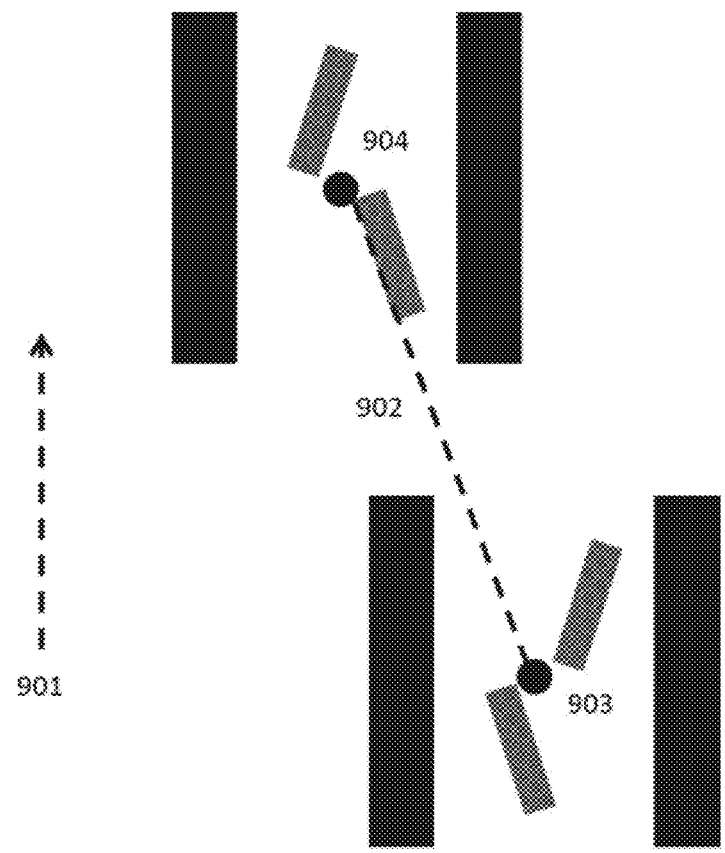
FIG. 9B

ORGANIC VAPOR JET PRINT HEAD WITH REDUNDANT GROUPS OF DEPOSITORS

CROSS-REFERENCE TO RELATED APPLICATIONS

This application claims priority to U.S. Patent Application Ser. No. 62/686,115, filed Jun. 18, 2018, the entire contents of which are incorporated herein by reference.

FIELD

The present invention relates to extending the operational lifetime of an organic vapor jet print head with a micronozzle array having a plurality of redundant groups of depositors that may be configured to print sets of features on the substrate.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include a micronozzle array having separate redundant groups of depositors that each include a delivery aperture disposed between two exhaust apertures. The device may include a first row of depositors of a first redundant group, each of which may be connected in parallel to first common delivery lines and first common exhaust lines. The device may include a second row of depositors of a second redundant group, each of which may be connected in parallel to second common delivery and second common exhaust lines. The first row of depositors and the second row of depositors of the device may operate independently from one another.

The first row of depositors and the second row of depositors of the device may be operated at different times from one another. The features printed on a substrate by a first group of depositors of the device may be functionally similar or the same to that of second group of depositors within the micronozzle array.

The micronozzle array of the device may include more than two redundant groups of depositors.

The first row of depositors and the second row of depositors of the device may be aligned along a printing direction.

The device may include a first delivery line and a first exhaust line fluidly coupled to the first row of depositors. A second delivery line and a second exhaust line may be fluidly coupled to the second row of depositors. The first delivery line and the second delivery line may be coupled at a first valve that switches a delivery flow from a common delivery line between the first delivery line and the second delivery line. The first exhaust line and the second exhaust line may be connected to a common exhaust line using a second valve that switches an exhaust flow from a common exhaust line between the first exhaust line and the second exhaust line. The first exhaust line may be fluidly coupled to a first flow controller, and the second exhaust line may be fluidly coupled to a second flow controller. The first flow controller and the second flow controller may regulate exhaust flow independently of each other.

According to an embodiment, a system may include a deposition chamber with a controlled atmosphere, and a print head, disposed within the deposition chamber and in proximity of a substrate, having a die with a micronozzle array at its tip held within a ported clamp. The system may include a first redundant group and a second redundant group disposed on the micronozzle array, where the first redundant group may be connected to a first delivery line and a first exhaust line which pass through the clamp, and the second redundant group may be connected to a second delivery line and a second exhaust line that pass through the clamp. The first delivery line and the second delivery line from the clamp may be coupled at a first valve that switches a delivery flow from a common delivery line between the first delivery line and the second delivery line.

The first exhaust line and the second exhaust line of the system may be connected to a common exhaust line using a second valve that switches an exhaust flow from a common exhaust line between the first exhaust line and the second exhaust line. The first exhaust line may be fluidly connected to a first flow controller, and the second exhaust line is fluidly connected to a second flow controller. The first flow controller and the second flow controller may regulate exhaust flow independently of each other.

The die of the system may be divided down its center such that first redundant group is connected to the first delivery line and the first exhaust line which pass through a first side of the clamp, and the second redundant group is connected to the second delivery line and a second exhaust line that pass through a second side of the clamp.

The first redundant group and the second redundant group of the system may be operated independently of one another. The first redundant group and the second redundant group may be operated at different times from one another.

Wetted components of the first valve and the second valve of the system may be heated to a temperature greater than a sublimation temperature of an organic vapor deposited by an OVJP (organic vapor jet printing) tool to prevent condensation.

The first valve and the second valve of the system may be positioned inside of the chamber to minimize the length of unused line when a section of at least one from the group consisting of: the first delivery line, the second delivery line, the first exhaust line, and the second exhaust line is shut off.

The system may include a common heated delivery line that may be disposed upstream of the first valve that is fed by one or more sublimation sources. The one or more sublimation sources may be independently heated and loaded with dissimilar materials to promote co-deposition of doped films. Each of the one or more sublimation sources may be provided with a controlled mass flow of heated process gas. The first redundant group includes at least one first depositor having a first aperture area, and the second redundant group includes at least one second depositor having a second aperture area. The at least one first depositor may be congruent to the at least one second depositor. The at least one second depositor may be congruent to a reflection of the at least one first depositor about a plane normal to a print direction. The at least one first depositor may be congruent to the at least one second depositor under a rotation of 180° about an axis normal to a substrate surface. One of the first redundant group or the second redundant group may be operated when a print direction is parallel to a segment extending from a center of mass of the first aperture area of the first depositor to a center of mass of the second aperture area of the second depositor.

According to an embodiment, a system may include a deposition chamber with a controlled atmosphere. The system may include a print head, disposed within the deposition chamber and in proximity of a substrate, having a die with a micronozzle array at its tip held within a ported clamp. The system may include a first redundant group of first depositors and a second redundant group of second depositors disposed on the micronozzle array, where a first delivery line feeds the first redundant group and the second delivery line feeds the second redundant group. The first delivery line may connect to a first sublimation source, and the second delivery line may connect to a second sublimation source. The first sublimation source and the second sublimation source each may have a separately controlled mass flow of heated process gas.

The system may include a first exhaust line and a second exhaust line fluidly coupled to the clamp, the first exhaust line and the second exhaust line may be fluidly connected to a common exhaust line using a valve that switches an exhaust flow from a common exhaust line between the first exhaust line and the second exhaust line. The system may include a first exhaust line that may be fluidly coupled to a first flow controller, and a second exhaust line that may be fluidly connected to a second flow controller, where the first exhaust line and the second exhaust line regulate exhaust flow independently of each other. The first exhaust line and the second exhaust line may each have at least one of independent flow control or pressure regulation.

The die of the system may be divided down its center such that first redundant group is connected to a first delivery line and a first exhaust line which pass through a first side of the clamp, and the second redundant group is connected to a second delivery line and a second exhaust line that pass through a second side of the clamp.

The first redundant group and a second redundant group of the system may be operated independently of one another. The first redundant group and a second redundant group may be operated at different times from one another.

The first redundant group of the system may include at least one first depositor having a first aperture area, and the second redundant group may include at least one second depositor having a second aperture area. The at least one first depositor of the system may be congruent to the at least one second depositor. The at least one second depositor may be congruent to a reflection of the at least one first depositor about a plane normal to a print direction. The at least one first depositor may be congruent to the at least one second depositor under a rotation of 180° about an axis normal to a substrate surface. One of the first redundant group or the second redundant group may be operated when a print direction is about parallel to a segment extending from a center of mass of the first aperture area of the first depositor to a center of mass of the second aperture area of the second depositor, and not aligned otherwise.

BRIEF DESCRIPTION OF THE DRAWINGS

FIGS. 8A-8C show example orientations that an aperture area of a depositor from one redundant group may have with respect to that of a depositor in another redundant group according to embodiments of the disclosed subject matter.

FIG. 9A-9B shows an example of depositors from different redundant groups on a micronozzle array that are aligned (as shown in FIG. 9A) and not aligned (as shown in FIG. 9B) with respect to the print direction according to embodiments of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
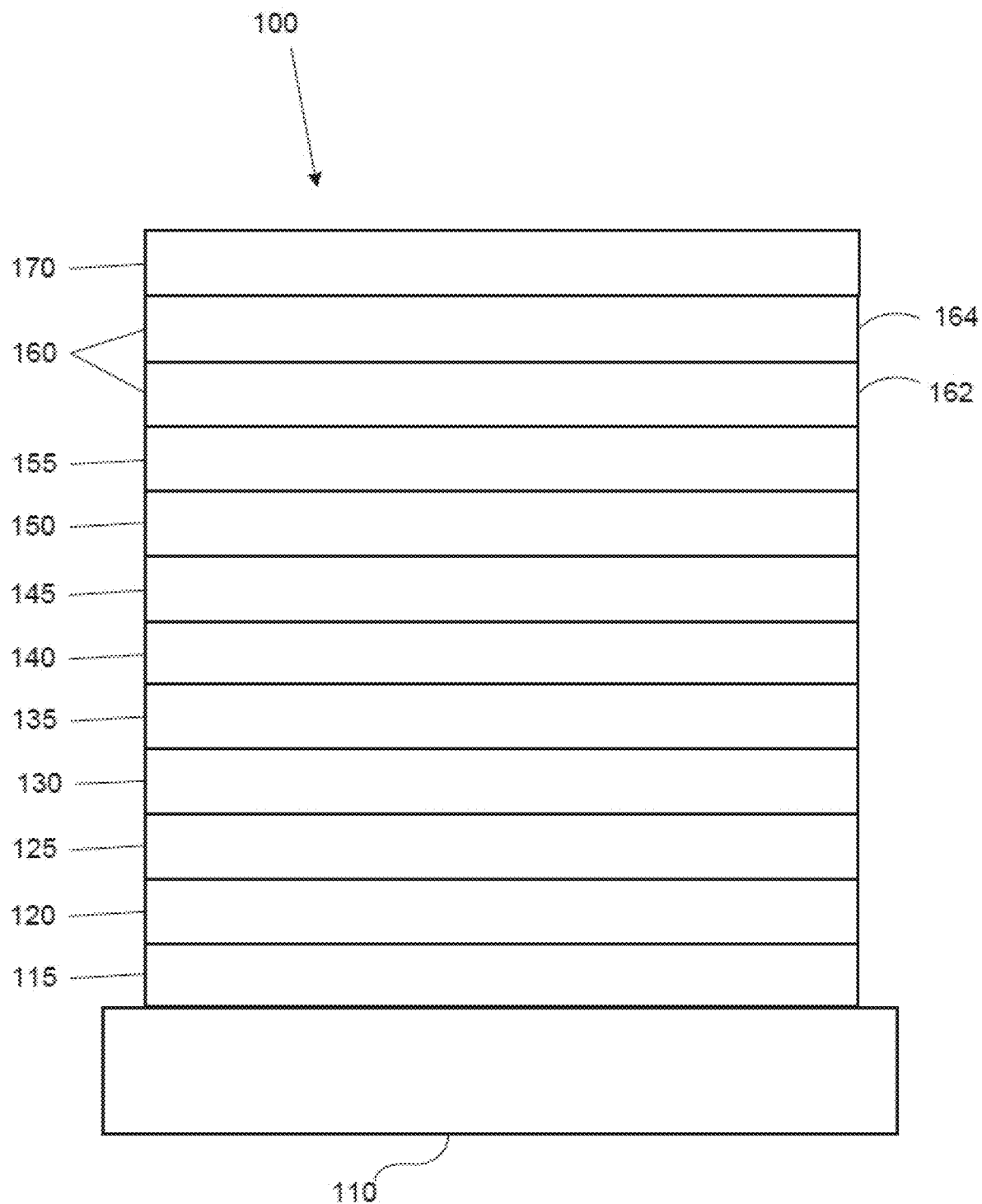
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
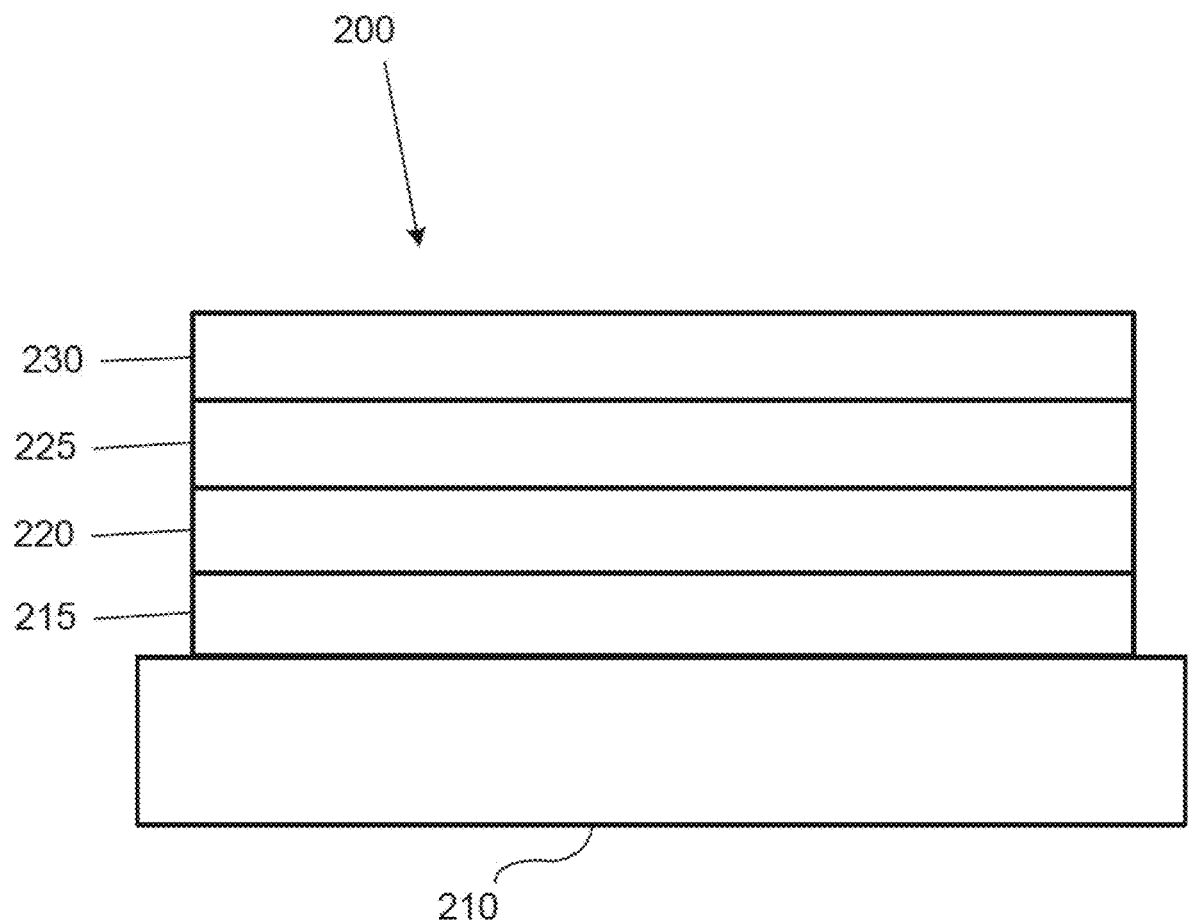
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present invention is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
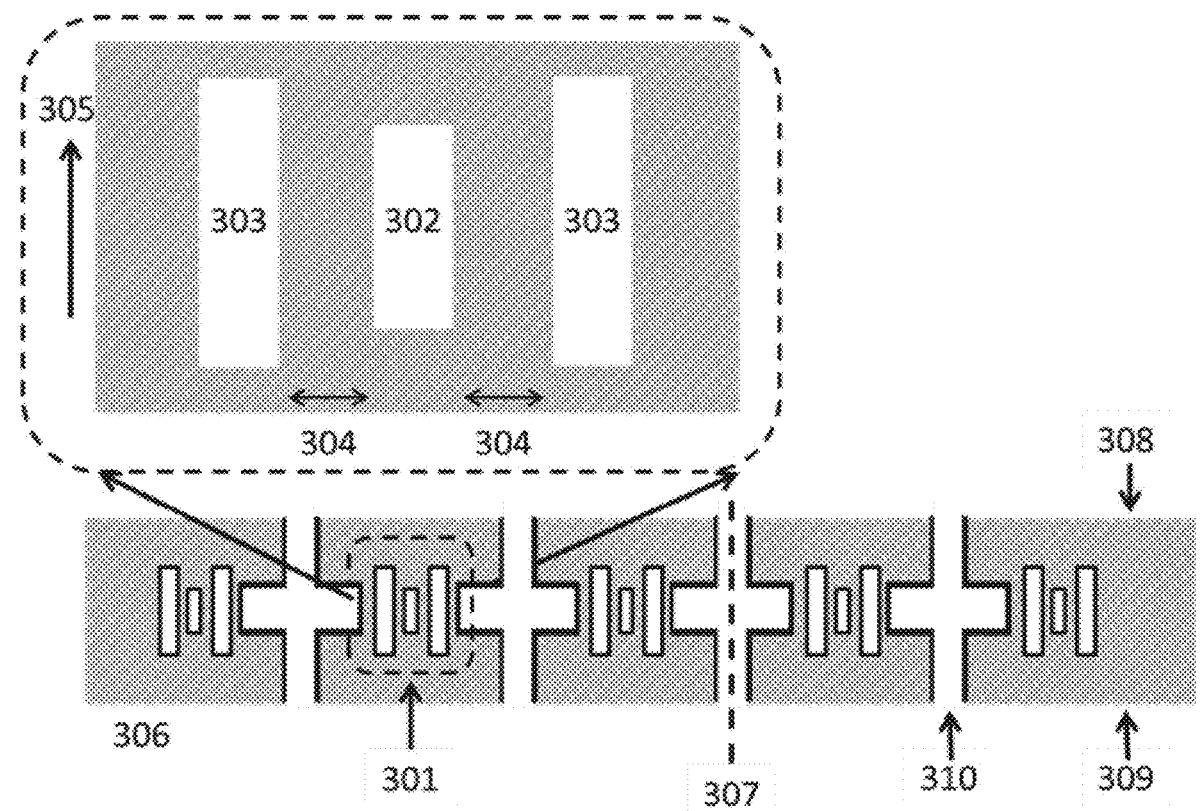
FIG. 3 shows a DEC (delivery-exhaust-confinement) depositor array with an expanded view of a single depositor.

FIG. 3 shows a DEC (delivery-exhaust-confinement) depositor array with an expanded view of a single depositor. Gas confinement may be different from previous OVJP concepts, as the depositor array may use a chamber pressure of 50 to 300 Torr, rather than a high vacuum. For example, typical VTE (vacuum thermal evaporation) may be performed at about 1E-7 Torr, and prior versions of OVJP used a high vacuum having tens of milli-Torr pressures. Overspray by one or more of the depositors of the array may be reduced and/or eliminated by using a flow of confinement gas to minimize and/or prevent the diffusion and transport of organic material away from the desired deposition region.

The DEC depositor design, shown from the perspective of the substrate in FIG. 3, may include planar surface 301 ported with one or more rectangular delivery apertures 302 located between a pair of exhaust apertures 303. The flow through the delivery apertures 302 may include organic vapor entrained in an inert delivery gas. The exhaust apertures 303 may withdraw gas from the region under the depositor at a mass flow rate exceeding the delivery flow. The exhaust apertures 303 may remove the delivery flow and any surplus organic vapor entrained within it, as well as a balance of confinement gas drawn from the ambient surrounding the depositor. Delivery apertures 302 and exhaust apertures 303 may be separated by a DE (deliver-exhaust) spacer 304. The delivery apertures 302 and the exhaust apertures may be arranged with their long axes parallel to the direction of printing 305.

Depositors may be arranged linearly on a micronozzle array 306, so that each depositor borders another on at least one side boundary 307. The top 308 and bottom 309 edges of the depositor may be defined by the edges of the micronozzle array. Distribution trenches 310 may be etched into the lower face of the depositor may provide a low impedance path for confinement gas so that its flow is evenly distributed across the side boundaries of each depositor. Alternately, confinement gas may flow in from the edges of the depositor, particularly if these channels are omitted. Mirconozzle array 306 may be configured to minimize crosstalk between depositors so that multiple printed features are similar or the same as possible across the width of the micronozzle array 306. Additional exhaust apertures can be placed at the ends of the array 306, for example, to minimize edge effects. The flow field under a micronozzle array 306 may be configured to have periodic symmetry.

Depositors may have apertures with a wide variety of shapes, and may be configured to produce features of specific sizes and feature profiles. Example configurations of depositor may be disclosed in U.S. Patent Publn. No. 2015/0376787, U.S. patent application Ser. No. 15/475,408 (now U.S. Patent Publn. No. 2017/0294615) and U.S. Patent application No. 62/511,730 (now U.S. patent application Ser. No. 15/981,482, which is published as U.S. Patent Publn. No. 2018/0342675), the entire contents of which are incorporated herein by reference. A depositor may be defined as a cluster of apertures within a micronozzle array which may be configured to print a single feature with the same or similar width and normalized thickness profile as one of features printed in a single pass of the entire micronozzle array. If a depositor includes multiple delivery apertures, these apertures may be fed from a common delivery channel.

The average thickness t of a printed film is given by $t=\eta_e j\tau/\rho$, where j may be the mass flux of organic vapor onto the substrate, $\tau$ may be the period of time a given point on the substrate is under the aperture, and $\rho$ may be the density of the condensed organic material. The utilization efficiency, $\eta_e$, may be the fraction of organic vapor issuing from the depositor that condenses on the substrate. Because $\tau=l/v$, where l may be the length of the aperture and v may be the relative velocity between the print head and the substrate, a longer delivery aperture may permit a given point on the substrate surface to remain under the aperture for a longer time at a given print speed. This may provide faster printing. The apertures of a DEC depositor may be generally made as long as manufacturing techniques provide for. While increased length improves printing speed, it may not typically improve the utilization efficiency $\eta_e$.

Figure 4:
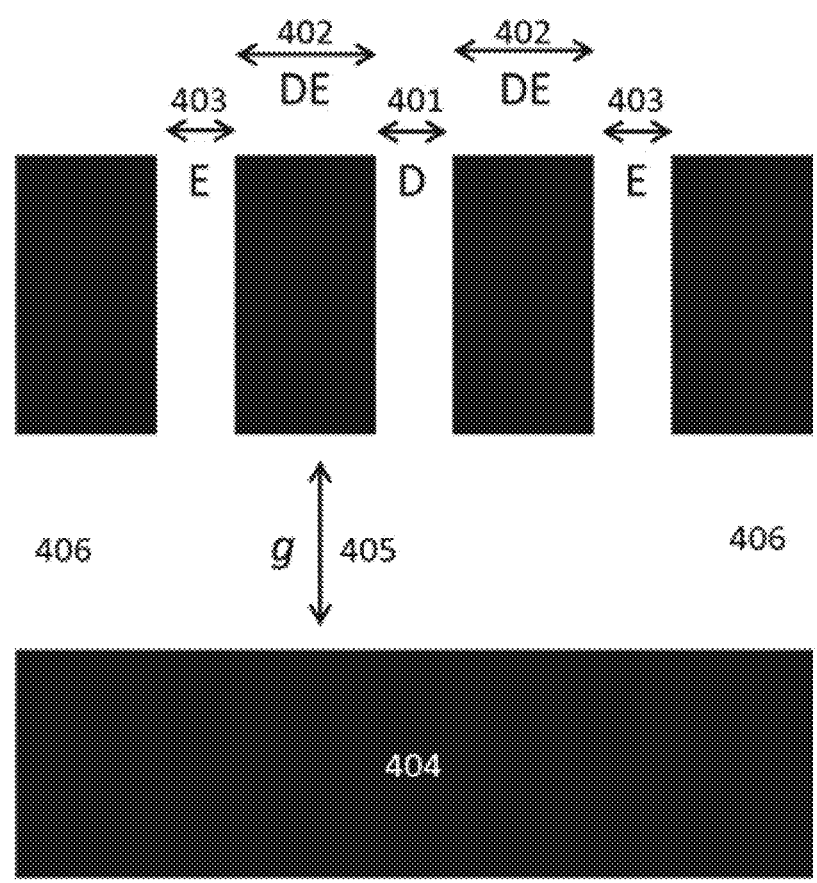
FIG. 4 shows a cross-sectional view of a single DEC depositor.

FIG. 4 shows a DEC depositor in cross-section normal to the direction of printing, as well as the dimensions defining the geometry of the depositor. The width of the delivery aperture 401 may be D. The mass flow rate of delivery gas through the delivery aperture may be QD. The spacers between the delivery and exhaust may have width DE 402 and the exhausts may have width E 403. The mass flow rate of gas through the exhaust apertures of a depositor may be QE. The depositor and substrate may be separated by a fly height gap g 405. Confinement gas may be fed into the depositor from the edges 406 at rate QC. The flow of confinement gas may oppose the outward spread of organic vapor and directs surplus organic vapor away from the deposition zone through the exhaust apertures.

Depositors configured to print high resolution (e.g., 8K resolution, which may be a resolution of 7680×4320) multicolor OLED displays arrays may include narrow apertures of 5-15 μm in width. Such apertures may typically be susceptible to fouling, and the parallelism of the micronozzle array may typically increase its susceptibility to fouling. Embodiments of the disclosed subject matter provide a DEC OVJP micronozzle array that may be tolerant to fouling. The embodiments of the disclosed subject matter may provide print head changes while printing on substrates may occur between the print head changes.

Embodiments of the disclosed subject matter provide a micronozzle array including redundant depositors such that the features printed on the substrate by one group of depositors is functionally similar or the same as that of a different, independent group of depositors within the same array. If a depositor in one group (e.g., a first group) becomes fouled and/or otherwise damaged, that group (e.g., the first group) of depositors may be deactivated and another group (e.g., a second group) of depositors may be activated. This arrangement may provide a print head which may remain in operation longer, thus reducing the downtime of an OVJP system and making it more economical to operate. Each group of depositors configured to print the desired pattern may be referred to as a redundant group.

Figure 5:
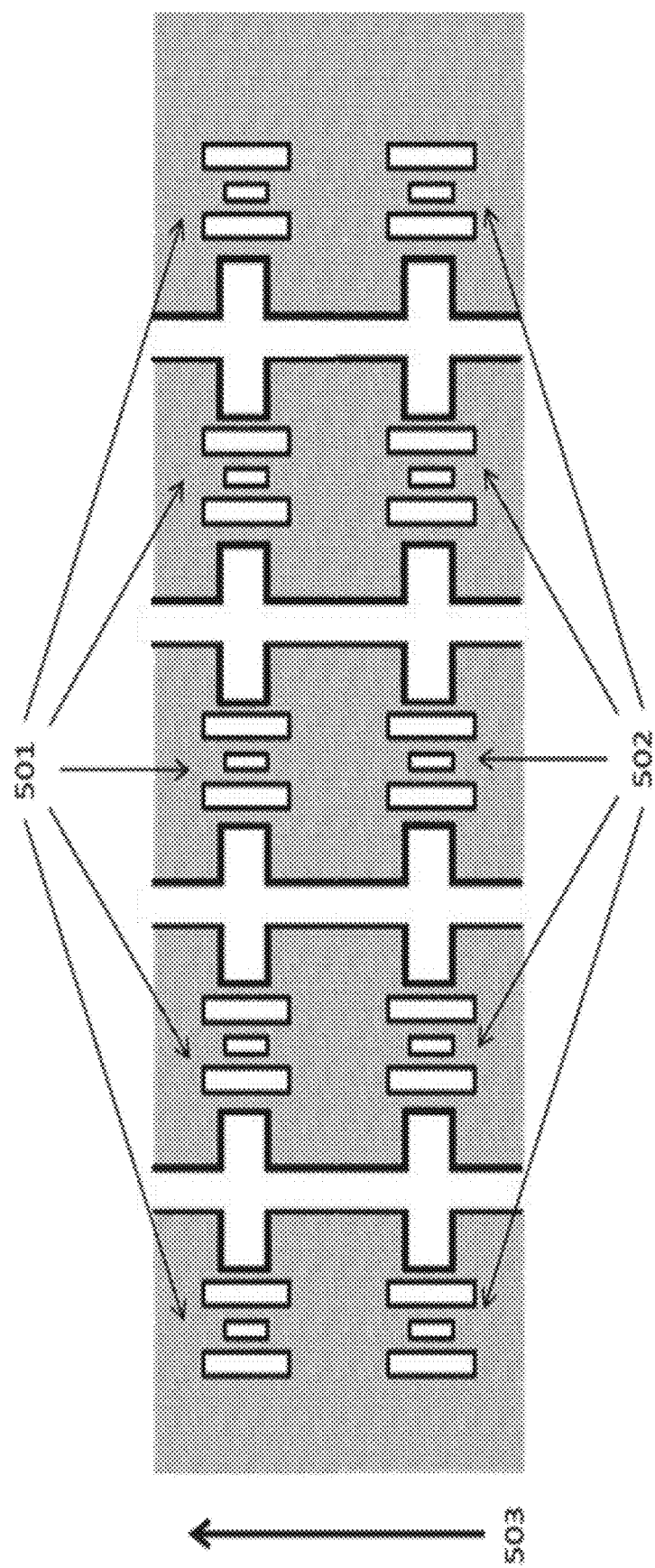
FIG. 5 shows a micronozzle array including two redundant groups of depositors according to an embodiment of the disclosed subject matter.

FIG. 5 shows an example of a micronozzle array with redundant groups according to an embodiment of the disclosed subject matter. The first row of depositors 501, which may include one redundant group, may be connected in parallel to common delivery and exhaust lines. The second row of depositors 502, which may include a second redundant group, may be connected in parallel to different common delivery and exhaust lines. The depositors 501, 502 may be aligned along the printing direction 503 in this example, or may be aligned in any other suitable direction.

A device including a micronozzle array, such as shown in FIG. 5, may have separate redundant groups of depositors (e.g., first row of depositors 501 and second row of depositors 502, as shown in FIG. 5) that each include a delivery aperture disposed between two exhaust apertures. The device may include a first row of depositors of a first redundant group (e.g., first row of depositors 501), each of which may be connected in parallel to first common delivery lines and first common exhaust lines. The device may include a second row of depositors of a second redundant group (e.g., second row of depositors 502), each of which may be connected in parallel to second common delivery and second common exhaust lines. The first row of depositors and the second row of depositors of the device may operate independently from one another, such that the first and second rows of depositors may use different materials (e.g., host materials, dopant materials, and the like). In some embodiments, that first and second rows of depositors may operate concurrently.

In some embodiments, the first row of depositors and the second row of depositors of the device may be operated at different times from one another. The features printed on a substrate by a first group of depositors (e.g., first row of depositors 501) of the device may be functionally similar or the same to that of second group of depositors (e.g., second row of depositors 501) within the micronozzle array.

Although FIG. 5 shows two groups of depositors, the micronozzle array of the device may include more than two redundant groups of depositors. As shown in FIG. 5, the first row of depositors (e.g., first row of depositors 501) and the second row of depositors (e.g., second row of depositors 502) of the device may be aligned along a printing direction (e.g., direction 503).

Figure 7:
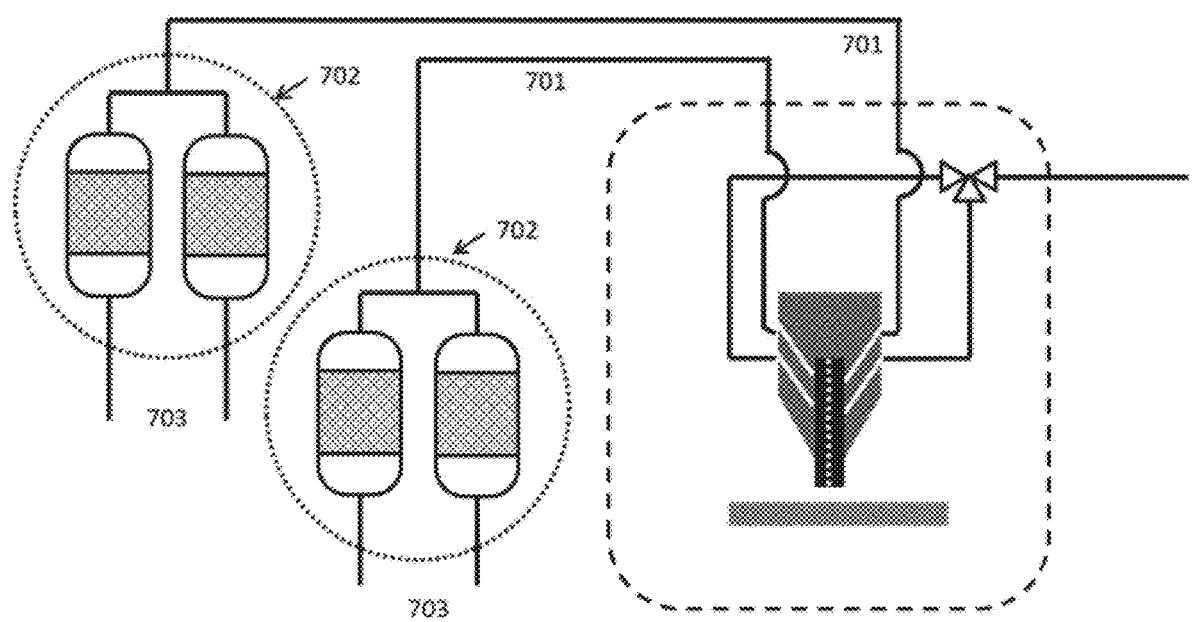
FIG. 7 shows a piping diagram of an OVJP system including a micronozzle array with two redundant groups of depositors with independently controlled delivery flows according to an embodiment of the disclosed subject matter.

The device of FIG. 5 may include a first delivery line and a first exhaust line fluidly coupled to the first row of depositors, as well as a second delivery line and a second exhaust line may be fluidly coupled to the second row of depositors (e.g., as shown in FIG. 7 and described below). The first delivery line and the second delivery line may be coupled at a first valve that switches a delivery flow from a common delivery line between the first delivery line and the second delivery line. The first exhaust line and the second exhaust line may be connected to a common exhaust line using a second valve that switches an exhaust flow from a common exhaust line between the first exhaust line and the second exhaust line. The first exhaust line may be fluidly coupled to a first flow controller, and the second exhaust line may be fluidly coupled to a second flow controller. The first flow controller and the second flow controller may regulate exhaust flow independently of each other.

Figure 6:
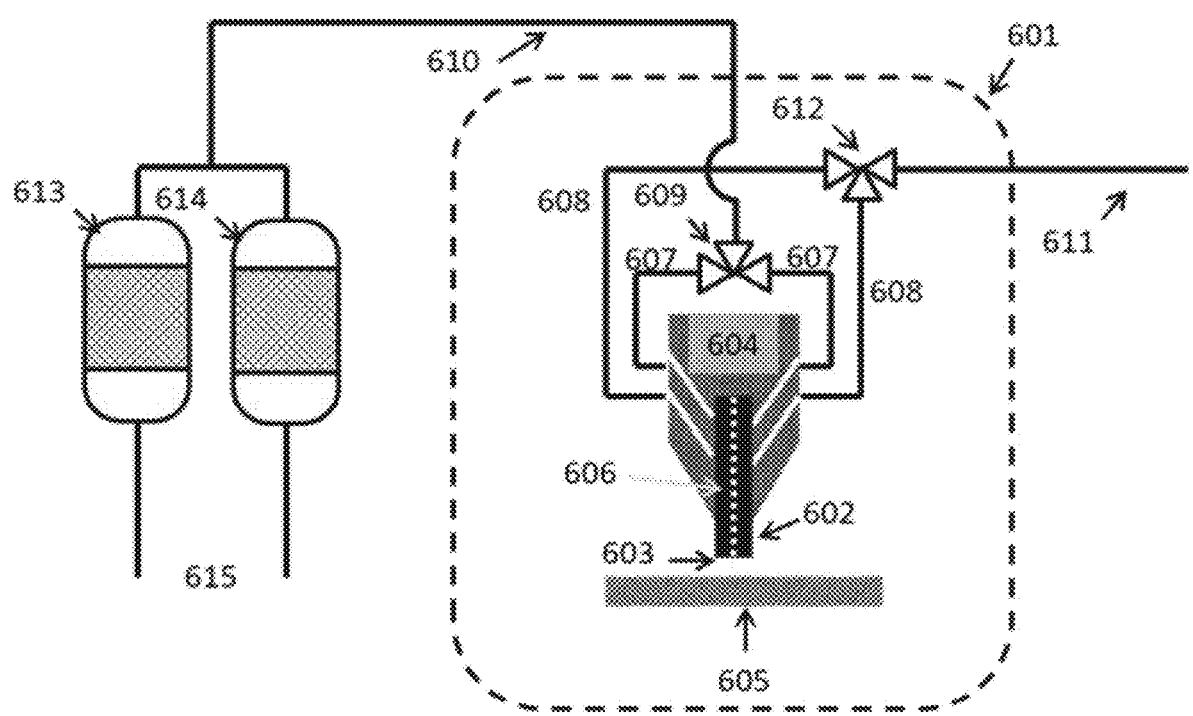
FIG. 6 shows a piping diagram of an organic vapor jet printing (OVJP) system including a micronozzle array with two redundant groups of depositors according to an embodiment of the disclosed subject matter.

In some embodiments, a micronozzle array may include more than two redundant groups of depositors. Redundant groups must be fluidly coupled to organic vapor sources such that delivery flow may be shut down to each redundant group. Local fouling in a single exhaust aperture may be produce overspray and generate printed features that may not meet desired specifications. The redundant groups provide true redundancy when deposition is completely turned off from a redundant group having a fouled and/or damaged depositor. FIG. 6 shows a piping diagram for an OVJP tool with depositors in two redundant groups according to an embodiment of the disclosed subject matter. The system show in FIG. 6 includes a deposition chamber 601 with a controlled atmosphere that has a print head having a die 602 with a micronozzle array at its tip 603 held within a ported clamp 604. The print head may be positioned above a substrate 605.

In some embodiments, the die 602 may be divided down its center 606 such that each of the two redundant groups on the micronozzle array is connected to its own delivery lines 607 and exhaust lines 608 passing through different sides of the clamp 604. The delivery lines 607 from each side of the clamp may be fluidly coupled to valve 609 (e.g., a three way valve) that switches the delivery flow from a common delivery line 610 between them. The exhaust lines 608 from each side of the clamp 604 may be fluidly coupled to a common exhaust line 611 through valve 612 (e.g., a three way valve). The wetted components of the valves 609, 612 may be heated to a temperature greater than the sublimation temperature of the organic vapor deposited to minimize and/or prevent condensation. The valves 609, 612 may be positioned inside of the chamber 601 to minimize the length of an unused line when a section of the delivery line 607 and/or exhaust line 608 is shut off. If this is the case, the valves 609, 612 may not outgas when at operational temperature. Organic vapor may be fed into the common heated delivery line 610 upstream of the valve 609 by one or more sublimation sources 613, 614. These sources 613, 614 may be independently heated and loaded with dissimilar materials to promote co-deposition of doped films. If so, vapors mix in the delivery line 610 to ensure even doping. Each source 613, 614 may be provided with a controlled mass flow of heated ultra-pure process gas 615.

According to an embodiment, a system may include a deposition chamber (e.g., deposition chamber 601 shown in FIG. 6) with a controlled atmosphere, and a print head, disposed within the deposition chamber and in proximity of a substrate (e.g., substrate 605), having a die (e.g., die 602) with a micronozzle array at its tip (e.g., tip 603) held within a ported clamp (e.g., clamp 604). The system may include a first redundant group and a second redundant group disposed on the micronozzle array, where the first redundant group may be connected to a first delivery line (e.g., delivery line 607) and a first exhaust line (e.g., exhaust line 608) which pass through the clamp, and the second redundant group may be connected to a second delivery line (e.g., delivery line 607) and a second exhaust line (e.g., exhaust line 608) that pass through the clamp. The first delivery line and the second delivery line from the clamp may be coupled at a first valve (e.g., valve 609) that switches a delivery flow from a common delivery line (e.g., common delivery line 610) between the first delivery line and the second delivery line.

The first exhaust line and the second exhaust line (e.g., exhaust lines 608) of the system may be connected to a common exhaust line (e.g., common exhaust line 611) using a second valve (e.g., valve 612) that switches an exhaust flow from a common exhaust line between the first exhaust line and the second exhaust line. The first exhaust line may be fluidly connected to a first flow controller, and the second exhaust line is fluidly connected to a second flow controller. The first flow controller and the second flow controller may regulate exhaust flow independently of each other.

The die (e.g., die 602) of the system may be divided down its center such that first redundant group is connected to the first delivery line (e.g., delivery line 607) and the first exhaust line (e.g., exhaust line 608) which pass through a first side of the clamp (e.g., clamp 604), and the second redundant group is connected to the second delivery line (e.g., delivery line 607) and a second exhaust line (e.g., exhaust line 608) that pass through a second side of the clamp (e.g., clamp 604).

In this embodiment, the first redundant group and the second redundant group of the system may be operated independently of one another, and/or may be operated at different times from one another.

Wetted components of the first valve (e.g., valve 609) and the second valve (e.g., valve 612) of the system of this embodiment may be heated to a temperature greater than a sublimation temperature of an organic vapor deposited by an OVJP (organic vapor jet printing) tool to prevent condensation.

The first valve (e.g., valve 609) and the second valve (e.g., valve 612) of the system may be positioned inside of the chamber (e.g., deposition chamber 601) to minimize the length of unused line when a section the first delivery line, the second delivery line, the first exhaust line, or the second exhaust line is shut off.

The system may include a common heated delivery line (e.g., common delivery line 610) that may be disposed upstream of the first valve (e.g., valve 609) that is fed by one or more sublimation sources (e.g., sources 613, 614). The one or more sublimation sources (e.g., sources 613, 614) may be independently heated and loaded with dissimilar materials to promote co-deposition of doped films. Each of the one or more sublimation sources (e.g., sources 613, 614) may be provided with a controlled mass flow of heated process gas.

In this embodiment, the first redundant group may include at least one first depositor having a first aperture area, and the second redundant group includes at least one second depositor having a second aperture area. The at least one first depositor may be congruent to the at least one second depositor. The at least one second depositor may be congruent to a reflection of the at least one first depositor about a plane normal to a print direction. The at least one first depositor may be congruent to the at least one second depositor under a rotation of 180° about an axis normal to a substrate surface. One of the first redundant group or the second redundant group may be operated when a print direction is parallel to a segment extending from a center of mass of the first aperture area of the first depositor to a center of mass of the second aperture area of the second depositor.

While delivery flow may be completely shut down to a redundant group of depositors that is not in use, exhaust flow may be drawn from unused redundant groups to prevent organic vapor from diffusing from their exhaust apertures onto the substrate. Multiple redundant groups may be operated simultaneously to increase a deposition rate. When a depositor in one redundant group becomes fouled and/or otherwise damaged, its delivery flow may be shut down and the remaining redundant groups may continue printing at a reduced rate. It may therefore be desirable to entirely separate the delivery path upstream of each redundant group so that they may be turned off independently.

FIG. 7 shows a piping diagram of an OVJP system including a micronozzle array with two redundant groups of depositors with independently controlled delivery flows according to an embodiment of the disclosed subject matter. The delivery lines 701 feeding each redundant group may be separate upstream of the micronozzle array and may each connect to their own set of sublimation sources 702, where each source 702 may have separately controlled mass flow of heated ultra-pure process gas 703. While it is not shown here, the exhaust lines may also be separate with independent flow control and/or pressure regulation.

The system shown in FIG. 7 may include a deposition chamber with a controlled atmosphere. The system may include a print head, disposed within the deposition chamber and in proximity of a substrate, having a die with a micronozzle array at its tip held within a ported clamp. The system may include a first redundant group of first depositors and a second redundant group of second depositors disposed on the micronozzle array, where a first delivery line feeds the first redundant group and the second delivery line feeds the second redundant group. The first delivery line may connect to a first sublimation source, and the second delivery line may connect to a second sublimation source. The first sublimation source and the second sublimation source (e.g., sources 702) each may have a separately controlled mass flow of heated process gas (e.g., heated ultra-pure process gas 703).

The system shown in FIG. 7 may include a first exhaust line and a second exhaust line fluidly coupled to a clamp, the first exhaust line and the second exhaust line may be fluidly connected to a common exhaust line using a valve that switches an exhaust flow from a common exhaust line between the first exhaust line and the second exhaust line. The system may include a first exhaust line that may be fluidly coupled to a first flow controller, and a second exhaust line that may be fluidly connected to a second flow controller, where the first exhaust line and the second exhaust line regulate exhaust flow independently of each other. The first exhaust line and the second exhaust line may each have at least one of independent flow control or pressure regulation.

The die of the system of FIG. 7 may be divided down its center such that first redundant group is connected to a first delivery line and a first exhaust line which pass through a first side of the clamp, and the second redundant group is connected to a second delivery line and a second exhaust line that pass through a second side of the clamp.

The first redundant group and a second redundant group of the system of FIG. 7 may be operated independently of one another. The first redundant group and a second redundant group may be operated at different times from one another.

The first redundant group of the system shown in FIG. 7 may include at least one first depositor having a first aperture area, and the second redundant group may include at least one second depositor having a second aperture area. The at least one first depositor of the system may be congruent to the at least one second depositor. The at least one second depositor may be congruent to a reflection of the at least one first depositor about a plane normal to a print direction. The at least one first depositor may be congruent to the at least one second depositor under a rotation of 180° about an axis normal to a substrate surface. One of the first redundant group or the second redundant group may be operated when a print direction is about parallel to a segment extending from a center of mass of the first aperture area of the first depositor to a center of mass of the second aperture area of the second depositor, and not aligned otherwise.

The depositors within each redundant group may generally have an aperture configuration that is similar to that of depositors in other redundant groups. FIGS. 8A-8C show example orientations that an aperture area of a depositor from one redundant group may have with respect to that of a depositor in another redundant group according to an embodiment of the disclosed subject matter. A depositor 801 in one redundant group may be congruent to a depositor of another redundant group 802 as shown in FIG. 8A. That is, the depositor 801 in a first redundant group may be mapped onto the depositor 802 using translation 803. Depositor 801 of the first redundant group may be congruent to depositor 804 from another redundant group about a plane 805 normal to the print direction as shown in FIG. 8B. Depositor 801 of the first redundant group may be congruent to a depositor 807 of another group under a rotation of 180° about an axis 806 normal to the substrate surface, as shown in FIG. 8C. The aperture configuration shown in FIGS. 8A-8C may be an example that illustrates different orientations depositors in different redundant groups may have with respect to each other. It is not intended to be either a preferred embodiment or limiting.

Apertures from multiple redundant groups need not be aligned in the general case, since the print head position may be adjusted relative to the substrate to ensure that the printed pattern is placed in a desired location if there is an offset between redundant groups. In some embodiments, one redundant group may be operated at a time if the different redundant groups are not aligned.

FIG. 9A-9B shows an example of depositors from different redundant groups on a micronozzle array that are aligned (as shown in FIG. 9A) and not aligned (as shown in FIG. 9B) with respect to the print direction according to embodiments of the disclosed subject matter. Depositors from different redundant groups may be considered to be aligned if the print direction 901 is parallel to a segment 902 extending from the center of mass of the aperture area 903 from one depositor to the center of mass of the other depositor 904. An example of aligned depositors from two redundant groups is shown in FIG. 9A and an example of unaligned depositors from two redundant groups is shown in FIG. 9B.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a micronozzle array having separate redundant groups of depositors that each include a delivery aperture disposed between two exhaust apertures, including:
   a first row of depositors of a first redundant group, each of which is connected in parallel to first common delivery lines and first common exhaust lines; and
   a second row of depositors of a second redundant group, each of which is connected in parallel to second common delivery and second common exhaust lines that are separate from the first common delivery lines and the first common exhaust lines,
   wherein the first row of depositors and the second row of depositors operate independently from one another.

2. The device of claim 1, wherein the first row of depositors and the second row of depositors are aligned along a printing direction.

3. The device of claim 1, further comprising:
   a first delivery line and a first exhaust line fluidly coupled to the first row of depositors;
   a second delivery line and a second exhaust line fluidly coupled to the second row of depositors,
   wherein the first delivery line and the second delivery line are coupled at a first valve that switches a delivery flow from a common delivery line between the first delivery line and the second delivery line.

4. The device of claim 3, wherein the first exhaust line and the second exhaust line are connected to a common exhaust line using a second valve that switches an exhaust flow from a common exhaust line between the first exhaust line and the second exhaust line.

5. The device of claim 3, wherein the first exhaust line is fluidly coupled to a first flow controller, and the second exhaust line is fluidly coupled to a second flow controller,
   wherein the first flow controller and the second flow controller regulate exhaust flow independently of each other.

6. A system comprising:
   a deposition chamber with a controlled atmosphere;
   a print head, disposed within the deposition chamber and in proximity of a substrate, having a die with a micronozzle array at its tip held within a ported clamp;
   a first redundant group and a second redundant group disposed on the micronozzle array,
   wherein the first redundant group is connected to a first delivery line and a first exhaust line which pass through the clamp, and the second redundant group is connected to a second delivery line and a second exhaust line that pass through the clamp, and
   wherein the first delivery line and the second delivery line from the clamp are coupled at a first valve that switches a delivery flow from a common delivery line between the first delivery line and the second delivery line, and the first exhaust line and the second exhaust line are connected to a common exhaust line using a second valve that switches an exhaust flow from a common exhaust line between the first exhaust line and the second exhaust line.

7. The system of claim 6, wherein the first exhaust line is fluidly connected to a first flow controller, and the second exhaust line is fluidly connected to a second flow controller,
   wherein the first flow controller and the second flow controller regulate exhaust flow independently of each other.

8. The system of claim 6, wherein the first redundant group includes at least one first depositor having a first aperture area, and the second redundant group includes at least one second depositor having a second aperture area.

9. The system of claim 8, wherein the at least one first depositor is congruent to the at least one second depositor.

10. The system of claim 9, wherein the at least one second depositor is congruent to a reflection of the at least one first depositor about a plane normal to a print direction.

11. The system of claim 9, wherein the at least one first depositor is congruent to the at least one second depositor under a rotation of 180° about an axis normal to a substrate surface.

12. A system comprising:
a deposition chamber with a controlled atmosphere;
a print head, disposed within the deposition chamber and in proximity of a substrate, having a die with a micronozzle array at its tip held within a ported clamp;
a first redundant group of first depositors and a second redundant group of second depositors disposed on the micronozzle array, wherein a first delivery line feeds the first redundant group and the second delivery line feeds the second redundant group,
wherein the first delivery line connects to a first sublimation source, and the second delivery line connects to a second sublimation source, and
wherein the first sublimation source and the second sublimation source each has a separately controlled mass flow of heated process gas.

13. The system in claim 12, further comprising:
a first exhaust line and a second exhaust line fluidly coupled to the clamp,
wherein the first exhaust line and the second exhaust line are fluidly connected to a common exhaust line using a valve that switches an exhaust flow from a common exhaust line between the first exhaust line and the second exhaust line.

14. The system in claim 12, wherein a first exhaust line is fluidly coupled to a first flow controller, and a second exhaust line is fluidly connected to a second flow controller, wherein the first exhaust line and the second exhaust line regulate exhaust flow independently of each other.

15. The system of claim 14, wherein the first exhaust line and the second exhaust line each have at least one of independent flow control or pressure regulation.

16. The system of claim 12, wherein the first redundant group includes at least one first depositor having a first aperture area, and the second redundant group includes at least one second depositor having a second aperture area.

17. The system of claim 16, wherein the at least one first depositor is congruent to the at least one second depositor.

18. The system of claim 17, wherein the at least one second depositor is congruent to a reflection of the at least one first depositor about a plane normal to a print direction.

19. The system of claim 17, wherein the at least one first depositor is congruent to the at least one second depositor under a rotation of 180° about an axis normal to a substrate surface, and
wherein one of the first redundant group or the second redundant group is operated when a print direction is about parallel to a segment extending from a center of mass of the first aperture area of the first depositor to a center of mass of the second aperture area of the second depositor, and not aligned otherwise.

* * * * *